United States Patent [19]

Smith

[11] Patent Number: 5,331,643
[45] Date of Patent: Jul. 19, 1994

[54] SELF-TESTING LOGIC WITH EMBEDDED ARRAYS

[75] Inventor: Gordon L. Smith, Poughkeepsie, N.Y.

[73] Assignee: International Business Machines Corporation, Armonk, N.Y.

[21] Appl. No.: 754,811

[22] Filed: Sep. 4, 1991

[51] Int. Cl.$^5$ .............................................. G01R 31/28
[52] U.S. Cl. .................................. 371/22.3; 371/22.1; 371/27
[58] Field of Search .......................... 371/22.1, 22.3, 27

[56] References Cited

U.S. PATENT DOCUMENTS

| | | | |
|---|---|---|---|
| 3,783,254 | 1/1974 | Eichelberger | 235/152 |
| 3,961,251 | 6/1976 | Hurley | 324/73 |
| 4,063,080 | 12/1977 | Eichelberger | 235/302 |
| 4,503,537 | 3/1985 | McAnney | 371/25 |
| 4,687,988 | 8/1987 | Eichelberger | 324/73 |
| 4,688,223 | 8/1987 | Matika | 371/27 |
| 5,150,044 | 9/1992 | Hashizume et al. | 371/22.3 X |

OTHER PUBLICATIONS

"RAM Read/Write Controlles during Self-Test" by R. Doney, Research Disclosure, Aug. 1989 #304.
"Fast Array Test & Diagnosis" by J. Savir, IBM TDB, vol. 34, No. 6, Nov. 1991.
"Array Built-In Self Test with Diagnostic Logic" by T. Jaber, IBM TDB, vol. 34, No. 1, Jun. 1991.
"Built-In Self-Test of Arrays Embedded in Logic Chips" by H. Bakoglu, IBM TDB, vol. 33, No. 1B, Jun. 1990.
"Deterministic Array Self-Test" by M. Peterson, et al. IBM TDB, vol. 33, No. 1A, Jun. 1990.
Method to Access Individual Embedded Arrays via Tester . . . Built-In Self-Test by H. Bakoglu, IBM TDB, vol. 33, No. 1A, Jun. 1990.
"Built-In Self/Test of Logic in the Presence of Embedded/Arrays" by H. Bakoglu IBM TDB, vol. 33, No. 1B, Jun. 1990.
Built-In Self-Test Architecture by T. Jaber IBM TDB, vol. 21, No. 12, May 1990.
True Complement Write Through Modes for Arrays by H. Bakoglu, IBM TDB, vol. 32, No. 11, Apr. 1990
Algorithmic Pattern Generation at the Tester by J. Ellison TDM TDB vol. 32, No. 6A, Nov. 1989.
Random Pattern Test Strategy for Logic Surrounding Embedded Arrays by D. Forlenza, IBM TDB, vol. 31, No. 11, Apr. 1989.
Embedded Array Self-Test Simulator by J. Bedford, IBM TDB vol. 31, No. 8, Jan. 1989.
Single Logic Cell Test Latch for AC Testing of Embedded Arrays by K. Torku, IBM TDB vol. 29, No. 3, Aug. 1986.
Embedded Array Test with ECIPT by O. Harstmann, IBM TDB, vol. 28, No. 6, Nov. 1985.
Specification of Device Isolation Requirements by operation by D. Pruden, IBM TDB vol. 28, No. 3, Aug. 1985.

(List continued on next page.)

Primary Examiner—Jack B. Harvey
Assistant Examiner—Kamini S. Shah
Attorney, Agent, or Firm—Lawrence D. Cutter

[57] ABSTRACT

Shift register latch scan strings employed in level sensitive scan design methodology for built-in circuit self-test are provided with bypassable portions which are made to serve effectively as address registers for arrays which are embedded in blocks of logic for which the scan strings are meant to provide pseudo-random excitation test data. Additionally, the bypassable portion of the scan strings is connected to an address stepper mechanism which insures complete coverage throughout the range of cell addresses within the array. This is accomplished through the utilization of a stepping counter or the utilization of an linear feedback shift register or similar mechanism. It thus becomes possible to insure that every cell address in the array is provided with known pseudo-random data at the beginning of a test and which is also capable of readily providing array cell content information at the end of the test and/or at various times during test.

7 Claims, 3 Drawing Sheets

OTHER PUBLICATIONS

Testing Logic Branch of Embedded Array Input Circuits with Limited Number of Inputs/Outputs by K. Daghir, IBM TDB vol. 27, No. 10A, Mar. 1985.

Demultiplexer Circuit for Testing Embedded Arrays by D. Omet, IBM TDB vol. 27, No. 4A, Sep. 1984.

Testing of Personalized Embedded Arrays by S. Guilioni IBM TDB vol. 26, No. 12, May 1984.

Auto-Incrementing Arrays for Data Collection & Initialization by B. McGilvray, IBM TDB, vol. 26, No. 7A, Dec. 1983.

Dynamic Testing of Multiple Embedded Arrays . . . with Limited I/O Capability by M. Shen, IBM TDB vol. 26, No. 7B, Dec. 1983.

Logic-Array Isolation for Testing by P. Goel IBM TDB vol. 23, No. 7A, Dec. 1980.

Forced Test Path Signal for Testing Embedded Arrays by A. Blum, IBM TDB vol. 22, No. 11, Apr. 1980.

Test Generation Sys for Mixed Technologies by E. Hsieh IBM TDB vol. 22, No. 8A, Jan. 1980.

Testing Embedded Arrays by R. Prestopnik IBM TDB, vol. 22, No. 8A, Jan. 1980.

Array Latch Model for Automatic Test Generation by N. Guydosh IBM TDB, vol. 22, No. 4, Sep. 1979.

Audit Check for Memory Testing by R. Bower, IBM TDB, vol. 21, No. 2 Jul. 1978.

Random Test Patterns to Logic Surrounding Embedded Arrays by P. Goel, IBM TDB vol. 20, No. 6, Nov. 1977.

Circuit Network Test by E. Muehldorf, IBM TDB, vol. 20, No. 1, Jun. 1977.

Self-Test of Random Access Memories by P. Bardell IBM TDB, vol. 26 No. 1, Jun. 1983.

Test Generation for VLSI Chips with Embedded Memories by E. Vida-Torku, IBM Journal of Res & Devel., vol. 34, No. 2/3, Mar./May 1990 pp. 276-288.

SELF-TESTING LOGIC WITH EMBEDDED ARRAYS

BACKGROUND OF THE INVENTION

The present invention is generally directed to built-in self-test logic circuitry used in conjunction with the design of electronic integrated circuit chip devices and systems. More particularly, the present invention is directed to circuits and a method for testing logic blocks which include memory arrays embedded therein.

As the packing density of integrated circuit chip devices has become greater, there has also appeared a greater need for the testing of such devices. In particular, built-in self-test methodologies have provided decided advantages in a wide range of circumstances. Even more particularly, the self-test method which employs level sensitive scan design (LSSD) methodology has proven to be particularly effective. In this approach to self-test, shift register latches, usually comprising a master and slave latch in each shift register latch pair, are connected together in a long scan string which operates in many ways like a shift register. These scan strings are provided with data which is used to drive blocks of combinatorial logic which are being tested. Likewise, scan strings are also employed to collect output signals from these logic blocks in response to known, albeit pseudo-random, input signals. These logic blocks are typically constructed using computer aided design methodology which models ideal physical behaviors. However, during fabrication it is possible to produce circuits which do not perform in complete conformance with the model. However, the computer aided design methods do provide a method of being able to define desired output sequences given specified input sequences. Thus it is generally possible to determine if the output signals collected via the scan strings represent desired output responses.

Because of the increasing complexity of these circuits and the number of possible input and internal state conditions, it is not possible to do exhaustive tests because the number of test vectors that would have to be employed is too large for test operations to be run in a reasonable length of time. Accordingly, pseudo-random pattern testing is employed. In this methodology, pseudo-random patterns are generated as input data to the logic block being tested. This pseudo-random data is typically generated by means of a pseudo-random pattern generator which is typically provided in the form of a linear feedback shift register (LFSR) whose outputs are used to provide pseudo-random data to one or more scan strings of shift register latches. The linear feedback shift register is typically constructed so as to cycle through pseudo-random state conditions in a manner in which a maximum amount of time elapses before a state is repeated. This is accomplished through suitable and well known methods for connecting the feedback elements in the LFSR.

The above methodology is very effective for testing blocks of logic circuitry. However, in those situations in which the block of logic circuitry includes an array structure, testing becomes much more difficult. Such array structures provide a memory function within the logic block. More particularly, the memory function provided by an array is such that, for test purposes, it is extremely desirable to be able to test or exercise each cell in the array. For purposes of the present discussion, the term "cell" is used to refer to all of those memory bit positions which are accessable using a single address. In order to test every cell in the array, it is necessary to access the array using all possible addresses. However, there is a significant problem in doing this using pseudo-random test data which is scanned into shift register latch scan strings. This pseudo-random data cannot guarantee the generation of all of the addresses needed to initialize cells in the embedded array and likewise cannot guarantee access to all of the data contained in the array for the same reason.

Moreover, for the initialization of embedded arrays for test purposes, one needs to know what values are stored in the array. It is noted however that it does not matter what values are stored, but only that their values can be ascertained ahead of time and can be repeated. However, since it is possible to externally control starting states of LFSR devices and to therefore provide known scan-in data to the scan strings, it is always possible to supply data input to various cell location in the array. Even though this data is effectively pseudo-random, it is still nonetheless known. However, with respect to the addresses, pseudo-random data supplied to the address lines of the array is not by itself sufficient to insure complete coverage of every address in the array. Thus, built-in self-test methodologies employing pseudo-random pattern excitation for array initialization purposes is difficult to apply when there is an array embedded within the block of logic being tested. Furthermore, there is an additional constraint in that when the tests are over, one wishes to ascertain what is finally in the array.

Additionally, it is noted that when logic blocks contain arrays, self-test isolation effectiveness would be greatly increased if there was a capability to rapidly initialize arrays with pseudo-random patterns and to rapidly form signatures on the array contents. These signatures are typically generated from scan out data which is used to drive a sensitive linear feedback shift register whose end state is very much dependent upon correct input of signals shifted out of the scan string.

Additionally, it is noted that in any given block of logic which is part of the built-in self-test LSSD methodology, it is also possible to encounter circumstances in which the block contains multiple numbers of array structures. Thus the problem of testing arrays becomes that much more difficult.

It is also noted that in logic testing in general, isolation effectiveness for error conditions is important. Thus, it is generally desirable to be able to break up a test into a series of many short tests each consisting of a much smaller number of patterns without loss of test coverage. In order to achieve this objective, it is important that arrays which are present in logic blocks be initialized quickly not only because the pseudo-random initialization state of arrays results in pseudo-random data from the array almost immediately, even for the first few patterns of a test but also because array contents are quickly checked. Thus, in any test mechanism, there should be a mechanism for the ability to perform multiple short tests as opposed to one long test because of the superior isolation results for failing test conditions. Thus with short tests, quicker isolation of faults during manufacturing and in the field is possible.

SUMMARY OF THE INVENTION

In accordance with a preferred embodiment of the present invention, a portion of a shift register latch scan string is dedicated for use as an address register which is used to control the addresses to which and from which pseudo-random data is read into and out of an array which is part of a logic block subject to being tested in using data contained within the scan string. Accordingly, a mechanism is provided for bypassing the flow of data through a portion of the scan string to avoid storage into this portion of pseudo-random data from the scan string. Instead, this portion of the array is provided with a separate address stepping mechanism which is preferably in the form of a single step incrementer or counter, but may also comprise an LFSR circuit. In this fashion, pseudo-random data including a known starting address can be scanned into the scan string including the address register portion, after which the address portion may be bypassed. During the bypass time, the address register portion of the scan string is stepped through a sequence of addresses. Here it is important to note that the addresses employed cover every cell address in the array. Here advantage can be taken of the fact that the order in which the array is filled or read is not important.

Thus, in accordance with a preferred embodiment of the present invention, a circuit is provided for supplying test signals to a logic block which contains an embedded array element. The circuit comprises a shift register latch scan string along with means to bypass a portion of the scan string. This bypassed portion of the scan string is connected with means for cycling shift register latches in the bypassed portion through a plurality of different states. Thus this bypassed portion, including read/write (R/W) control mechanisms is used to provide address signals for the array. In this way, the array may be quickly and completely loaded with known pseudo-random patterns.

Accordingly, it is an object of the present invention to provide a mechanism which allows testing of arrays embedded in logic blocks.

It is also an object of the present invention to provide a method for rapidly and completely loading embedded arrays with pseudo-random values.

It is yet another object of the present invention to provide a method for rapidly and completely checking array contents.

It is a still further object of the present invention to provide a method for testing logic blocks by extending well known built-in self-test methodologies.

It is an additional object of the present invention to extend the applicability of level sensitive scan design methods.

It is a still further object of the present invention to extend the advantages of built-in self-testing to logic blocks which incorporate array elements.

Lastly, but not limited hereto, it is an object of the present invention to provide a mechanism for employing a plurality of short test sequences as opposed to longer sequences which may not be as effective for fault isolation analysis.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
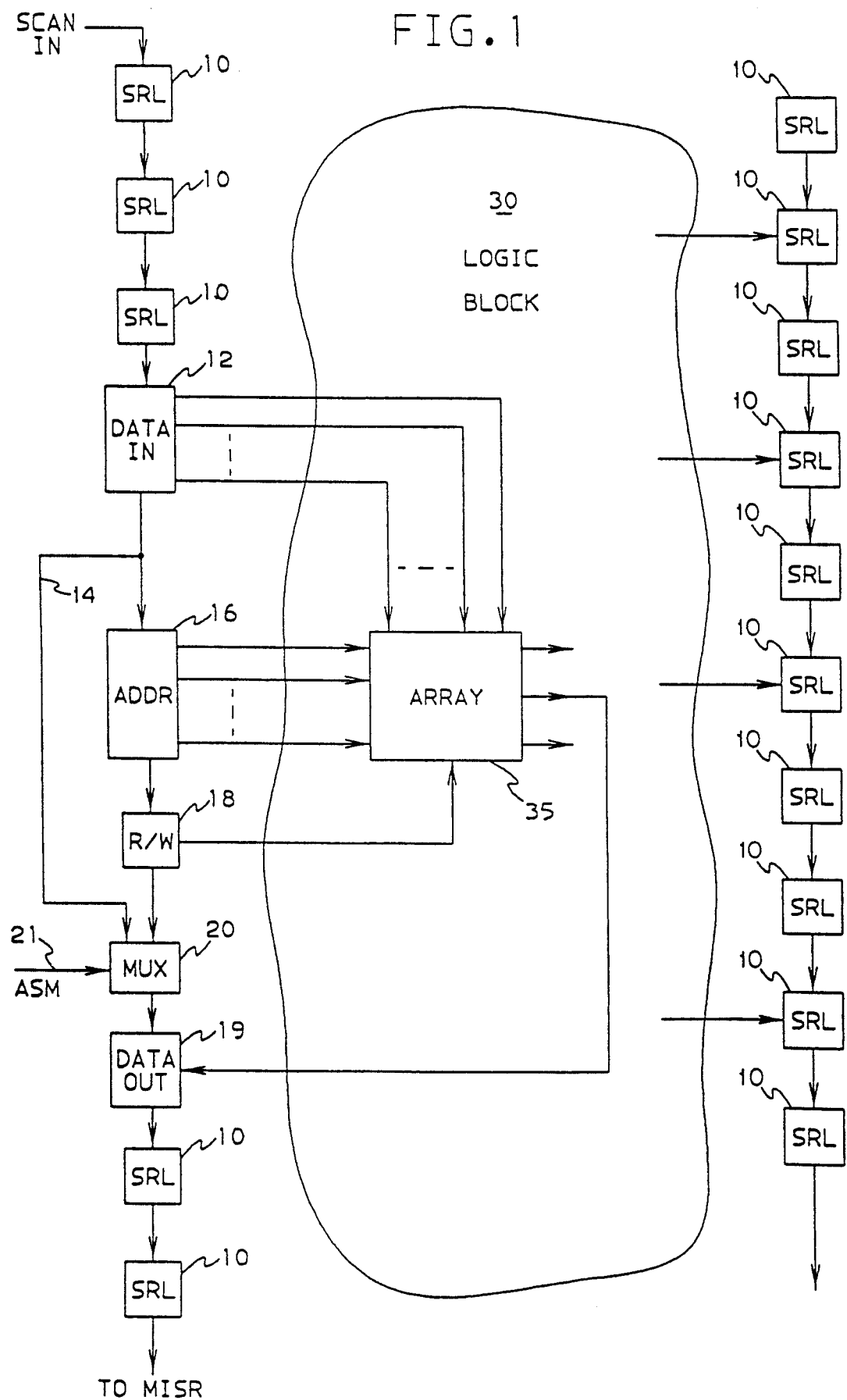
FIG. 1 is an overall block diagram illustrating the use of the present invention in conjunction with a logic block containing an embedded array.

FIG. 1 illustrates a preferred embodiment of the present invention. More particularly, FIG. 1 illustrates the present invention employed in its operating environment providing test signals to logic block 30 which includes embedded array 35. Apart from MUX unit 20, the remaining portion of the scan-in chain forms a portion of a shift register latch scan string which comprises shift register latches (SRL) 10, and shift register latches 12, 16 and 18 grouped for convenience as data-in register, address register, and read/write (R/W) control line register respectively. In particular, it is noted that data-in register 12 preferably comprises a string of shift register latches 10. This is also true of address register 16. Since the read/write control signal for an array is only one bit in length, read/write control register 18 only needs to comprise a single shift register latch.

It is noted that the shift register latch scan string not only functions to provide test signals to logic block 30 during test operations, but in addition, the scan string also functions to provide operative signals to block 30 during normal (non-test) circumstances. However, since this function does not relate to the present invention, the signal lines for this are not shown.

It is to be particularly noted that logic block 30 includes embedded array 35. Such arrays are commonly employed to provide memory functions for the more flexible control of logic circuits. Such arrays require three input signal types (data, address, read/write control) and provide a single signal output function. In particular, data signals from data register 12, appearing on the output signal lines from register 12 provide the data which can be read into array 35. In particular, this data can be read into a cell in array 35 which is specified by the address in address register 16. It is the control of address register 16 which is of primary importance in understanding the operation of the present invention. This address register is used to enter data into array 35 under the control of read/write control register 18. Likewise, by changing the bit in register 18 it becomes possible to read data from array 35 which is stored in the address specified by address register 16. This data typically appears in an output register (see reference numeral 19 in FIG. 1). In a preferred embodiment of the present invention, data output register 19 comprises shift register latches 10 from the scan string shown on the right side of logic block 30 in FIG. 1. It is also possible for the scan string shown on the right side of block 30 to be a continued portion of the scan string shown on the left side.

If a mechanism were not provided to bypass data from register 12, then pseudo-random address information would be supplied to register 16. While there is nothing wrong per se with permitting this to happen, when it happens in this way, one loses the ability to insure that every cell in array 35 is accessed. Accordingly, at some point in time the scanned-in data is prevented from reaching address register 16. This is preferably controlled by means of suppressing the scan clock signal to registers 16 and 18 under control of Array Scan Mode control line (ASM) 21. It is noted that while FIG. 1 shows data register 12 and address register 16 adjacent to one another in the scan string shown, it is not necessary that this be the case. For example, it is possible that registers 12 and 16 be separated from one another by one or more shift register latches 10. Additionally, it is noted that data register 12 could in fact come after address register latch 16 (that is, "downstream" in the scan path) although this is not preferred.

Additionally, multiplexer unit (MUX) 20 is preferably provided as a bypass selecting route for signals traversing the scan string. It is noted however, that it is possible to direct the left hand output signal line 14 directly to a multiple input signature register (MISR) or the like (reference numeral 50 in FIG. 3).

Figure 2:
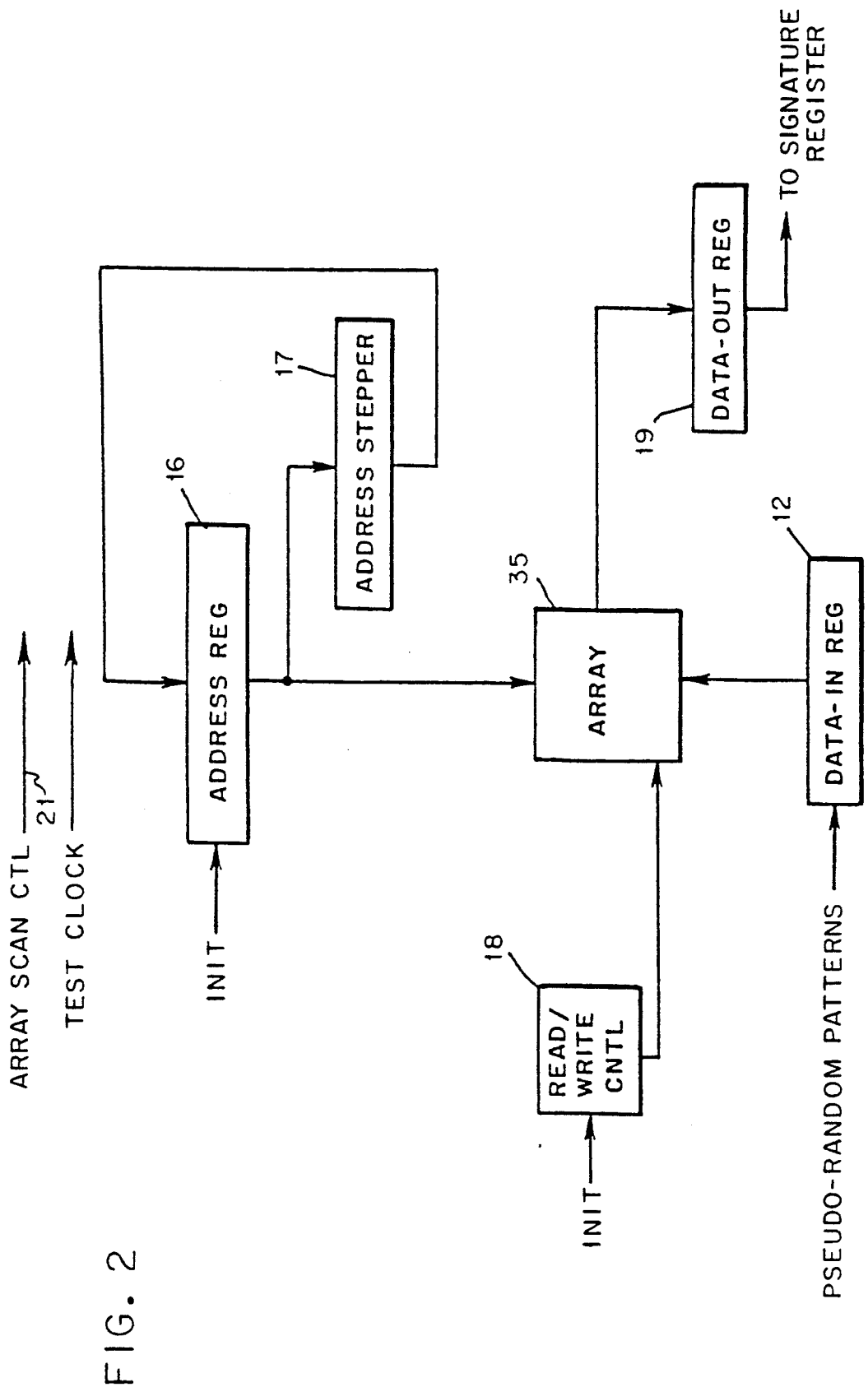
FIG. 2 is a logic block diagram circuit illustrating the mechanism for addressing stepping through the embedded array.

In summary, then it is important to understand that suppressing of the scan clock provides a mechanism for interrupting the flow of pseudo-random data into address register 16 which is connected to array 35 as a mechanism for providing addresses for the cells therein. Clearly then, the address information changes that occur in register 16 are brought about by other mechanisms. Accordingly, in order to appreciate these mechanisms, attention is now directed to the block diagram shown in FIG. 2.

In particular, it is seen that address stepper 17 is provided. Address stepper 17 may also comprise a linear feedback shift register (LFSR) together with a mechanism for detecting the all zero state and correspondingly therefore a mechanism for insuring that this state does occur as a valid address to be supplied to address register 16. Generally the skipping of the zero address in the array is not desired, although there may be circumstances where it is acceptable. Therefore, address stepper 17 may comprise what is generally known as a deBruijn counter. Since the sequencing order exhibited by address stepper 17 need not be the same as the address order for array 35, the addressing sequencing hardware in the form of a linear feedback shift register or a deBruijn sequencer is quite economical in terms of circuitry required.

The present invention therefore adds a signal line referred to herein as Array Scan Mode (ASM). If this signal is active, the transfer of self-test data is modified so that pseudo-random data is supplied to data-in register 12 and data from register 19 is compressed into signature register (reference numeral 50 in FIG. 3) without any alteration of the read/write controls or the address registers. When the ASM signal line is inactive, scan paths act normally for all SRL's. If Array Scan Mode (ASM) is active however, then the issuance of a signal referred to as Clock in FIG. 2 causes action described in the next two paragraphs below to take place without alteration of the following: pseudo-random data to be transferred to the data-in register, data read out of the arrays which is to be transferred to signature registers or the read/write controls. Address stepping and array write and array read (to data-out registers) are performed under control of the TEST CLOCK signal.

As indicated above, it is an important aspect of the problem that each array be initialized with known but possibly pseudo-random data. In order to perform this function with this invention, address register 16 is initialized to a starting address. Array read/write (R/W) control 18 is initialized to the write state and data-in register 12 is initialized with a pseudo-random pattern. Typically these parameters are all initialized via scan-in along the scan path with signal line ASM inactive. The array scan control signal is activated and the following steps are repeated alternately until at least all words of the array are loaded with pseudo-random values: first a clock pulse is issued which causes the array words specified by the address register to be written with the contents of the data-in register 12 and address register 16 is stepped to the next successive address. Secondly, a new pseudo-random pattern is transferred to data-in register 12, typically by scan-in operation. This is repeated for as many times as it takes to fill the array with the desired data.

With respect to signature information for each array, the following operations are carried out. First, address register 16 is initialized to a starting address and the array read/write control SRL 18 is initialized to the read state. Typically, these are initialized via the scan-in data path. The array scan control signal is activated and the following steps are repeated alternately until all words of the array are read out. First a test clock pulse is issued which causes the array words specified by the address register to be read into data-out register 19 and address register 16 is stepped to the next successive address. Secondly, data-out register information is transferred down the scan path.

In those implementations which transfer pseudo-random data to data-in register 12 and data from data-out register 19 to the signature register by shifting, the execution time is in part, determined by the number of shifts required per address. To obtain completely independent pseudo-random patterns for each array address, enough shifts are made after each address is written to replace all bits in data-in register 12 with new pseudo-random bits. If some correlation is acceptable, then fewer shifts per address may be adequate. The transfer of data from the data-out register 19 requires that the data be shifted enough times after each address is read so that future array operations do not overwrite the data.

Figure 3:
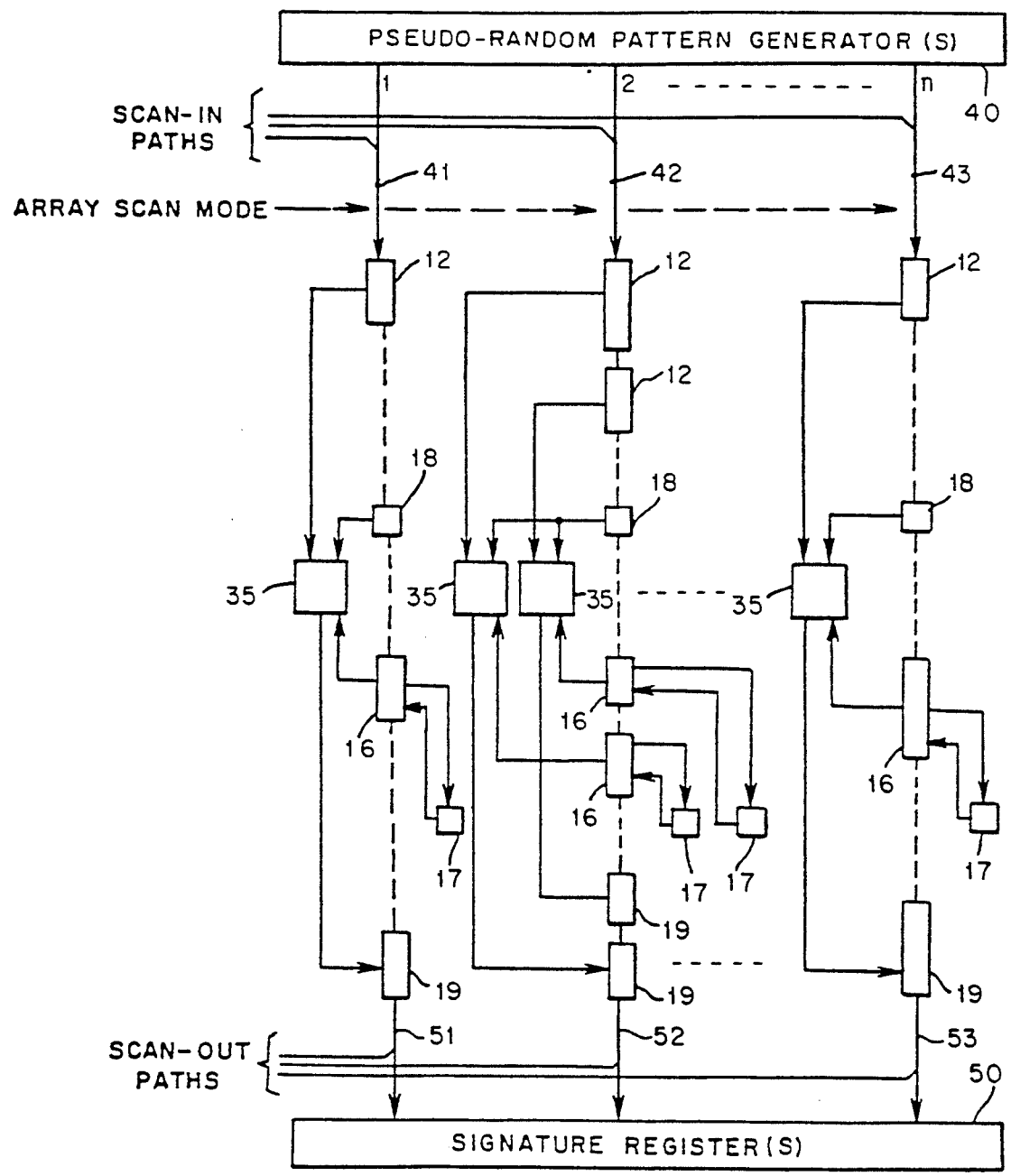
FIG. 3 is a logic block diagram circuit illustrating the employment of the present invention in a plurality of scan strings which are provided with pseudo-random patterns and whose outputs are eventually supplied to one or more signature registers.

The present invention is also particularly applicable to those situations in which multiple arrays are present. This situation is illustrated in FIG. 3 which also shows address register stepping mechanism 17 in position in several scan strings. For clarity, bypassing function aspects are not shown in FIG. 3.

In terms of multiple array considerations, if paths for inputting pseudo-random patterns and transferring data-out register contents to signature registers can be run in parallel, then the invention is capable of processing multiple arrays in parallel. Since each array or array group has its associated address register, all addresses may be incremented simultaneously. The invention specifically allows for the possibility of a single path having registers for more than one array. This is in particular illustrated in the middle portion of FIG. 3.

In the simplest implementation of the present invention, the minimum number of shifts for array pseudo-random initialization is about equal to the product of the greatest number of addresses in any array and the maximum number of shifts required to load a new pseudo-random pattern into all data-in registers 12 in any one path; and the minimum number of shifts for array signature formation is about equal to the product of the greatest number of addresses in any array and the maximum number of shifts required to move data out of all data-out registers 19 in any one path.

In addition to the situation involving multiple arrays, FIG. 3 also illustrates the use of the present invention employed in a so-called self-test using MISR and parallel SRSG environment. In particular, FIG. 3 illustrates the presence of several parallel scan paths. The scan paths are used for scanning, for transferring pseudo-random patterns to latches and for forming signatures on the latch contents.

For purposes of the present invention, data in registers 12 are preferably located close to the entry points of each scan path and data-out registers 19 are preferably located close to the exit points for each scan path. These placements ease maintenance of integrity of incoming and outgoing data when clock pulses are issued.

Pseudo-random initialization of arrays requires as few as one shift of the scan paths per address if some correlation between the patterns at various addresses is acceptable. For signature formation, the number of shifts of the scan paths is at least as large as the maximum number of data-out register bits in any scan path.

In one mode of operating the present invention, the read/write controls are designed to execute signature formation and initialization in one pass. In this case, two clock pulses are issued between each set of shift operations. The first clock pulse results in the read operations and the second clock pulse results in the write operations along with stepping of the address register. This results in higher execution speed.

Additionally, the invention is also usable to quickly check arrays for DC fault conditions by alternately initializing all arrays with pseudo-random patterns and forming signatures on all arrays. A relatively small number of repetitions results in a thorough checkout. Alternatively, regular patterns are used for fast array checking. Regular patterns are generated by first initializing data-in registers 12 with the desired values and then using the present invention to write all array words without ever shifting new values into data-in registers 12.

From the above, it should be appreciated that, through the addition of relatively simple hardware to a self-test environment requirements, the testing of embedded arrays becomes much easier and effective to perform. It is also seen that the invention extends and enhances the opportunities for applying the benefits of level sensitive scan design methodologies to more complicated and dense circuit patterns. It is also seen that the apparatus and method of the present invention provide greater flexibility with respect to the scanning-in and scanning-out of information and also provide greater flexibility with respect to those situations in which multiple arrays are embedded in logic blocks. Lastly, it should also be appreciated that the present invention achieves all of the aforementioned objects.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A circuit for providing test signals to a logic block containing an array, said circuit comprising:
   a shift register latch scan string;
   means to bypass a portion of said scan string;
   means to independently cycle the shift register latches in said bypassable scan string portion through a plurality of different states.

2. The circuit of claim 1 in which said plurality of different states includes all of the different states which said bypassable scan string portion is capable of exhibiting.

3. The circuit of claim 1 in which said bypass means includes a two input multiplexer circuit.

4. The circuit of claim 1 in which said bypassable scan string portion includes a shift register latch for providing read/write control signals to said array.

5. The circuit of claim 1 further including said logic block and said array therein, with said bypassable portion connected to provide address information to said array.

6. The circuit of claim 5 in which a nonbypassed portion of said scan string is used to provide data information to said array.

7. The circuit of claim 5 in which a portion of said scan string is used to provide a data output register for said array.

* * * * *